US009447306B2

(12) United States Patent
Minami et al.

(10) Patent No.: US 9,447,306 B2
(45) Date of Patent: Sep. 20, 2016

(54) CMP POLISHING FLUID, METHOD FOR MANUFACTURING SAME, METHOD FOR MANUFACTURING COMPOSITE PARTICLE, AND METHOD FOR POLISHING BASE MATERIAL (75) Inventors: Hisataka Minami, Hitachi (JP); Keisuke Inoue, Hitachi (JP); Chisato Kikkawa, Hitachi (JP); Yutaka Nomura, Hitachi (JP); Tomohiro Iwano, Hitachi (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 13/981,766

(22) PCT Filed: Jan. 20, 2012

(86) PCT No.: PCT/JP2012/051152
§ 371 (c)(1),
(2), (4) Date: Aug. 14, 2013

(87) PCT Pub. No.: WO2012/102187
PCT Pub. Date: Aug. 2, 2012

(65) Prior Publication Data
US 2014/0051250 A1 Feb. 20, 2014

(30) Foreign Application Priority Data

Jan. 25, 2011 (JP) .................... 2011-012890
Apr. 26, 2011 (JP) .................... 2011-098476

(51) Int. Cl.
*C09G 1/02* (2006.01)
*H01L 21/306* (2006.01)
*C09K 3/14* (2006.01)
*H01L 21/3105* (2006.01)
*B24B 37/04* (2012.01)

(52) U.S. Cl.
CPC ............... *C09G 1/02* (2013.01); *B24B 37/044* (2013.01); *C09K 3/1463* (2013.01); *H01L 21/30625* (2013.01); *H01L 21/31053* (2013.01)

(58) Field of Classification Search
None
See application file for complete search history.

(56) References Cited

U.S. PATENT DOCUMENTS

| 5,697,992 | A | * | 12/1997 | Ueda et al. ...................... 51/307 |
| 5,750,090 | A | * | 5/1998 | Yoshida et al. ................. 424/59 |
| 6,110,396 | A | * | 8/2000 | Ronay ................. H01L 21/7684 216/100 |
| 6,270,395 | B1 | * | 8/2001 | Towery et al. ................. 451/41 |

(Continued)

FOREIGN PATENT DOCUMENTS

| CN | 101302404 | 11/2008 |
| JP | 1-190626 | 7/1989 |

(Continued)

OTHER PUBLICATIONS

Translation of the International Preliminary Report on Patentability dated Aug. 8, 2013, for International Application No. PCT/JP2012/051152.

*Primary Examiner* — Allan Olsen
(74) *Attorney, Agent, or Firm* — Fitch, Even, Tabin and Flannery LLP (57) ABSTRACT A CMP polishing liquid comprises water and an abrasive particle, wherein the abrasive particle comprises a composite particle having a core including a first particle, and a second particle provided on the core, the first particle contains silica, the second particle contains cerium hydroxide, and the pH of the CMP polishing liquid is equal to or lower than 9.5.

17 Claims, 1 Drawing Sheet (56) References Cited

U.S. PATENT DOCUMENTS

| | | | |
|---|---|---|---|
| 6,464,740 B1* | 10/2002 | Towery et al. | 51/307 |
| 6,602,439 B1* | 8/2003 | Hampden-Smith et al. | 252/79.1 |
| 6,645,265 B1* | 11/2003 | Wang | C03C 19/00 106/3 |
| 6,827,639 B2* | 12/2004 | Nishida et al. | 451/330 |
| 2002/0042342 A1* | 4/2002 | Mussmann | B01D 53/945 502/304 |
| 2003/0118824 A1 | 6/2003 | Tokarz et al. | |
| 2004/0065022 A1* | 4/2004 | Machii | C09G 1/02 51/309 |
| 2004/0175941 A1* | 9/2004 | Zhang et al. | 438/689 |
| 2004/0192172 A1* | 9/2004 | Towery et al. | 451/41 |
| 2005/0028450 A1 | 2/2005 | Xu et al. | |
| 2005/0136670 A1* | 6/2005 | Ameen | H01L 21/3212 438/691 |
| 2005/0194357 A1* | 9/2005 | Liu | C09K 3/1463 216/88 |
| 2005/0194562 A1* | 9/2005 | Lavoie, Jr. | C09G 1/02 252/79.1 |
| 2006/0024434 A1* | 2/2006 | Wang et al. | 427/212 |
| 2006/0032146 A1* | 2/2006 | Partch et al. | 51/298 |
| 2006/0118760 A1* | 6/2006 | Yang et al. | 252/79.1 |
| 2007/0270085 A1* | 11/2007 | Ota | C09G 1/02 451/36 |
| 2008/0153975 A1* | 6/2008 | Lubnin | C08F 2/18 524/585 |
| 2008/0279744 A1* | 11/2008 | Robinson | B82Y 30/00 423/263 |
| 2009/0202816 A1* | 8/2009 | Schlenoff | 428/331 |
| 2010/0311308 A1* | 12/2010 | Suratwala et al. | 451/5 |
| 2010/0329954 A1* | 12/2010 | Yokota | B01D 53/945 423/213.2 |
| 2011/0039475 A1* | 2/2011 | Hoshi | B24B 37/044 451/28 |
| 2011/0245391 A1* | 10/2011 | Karpov | C08K 9/10 524/262 |
| 2012/0077419 A1* | 3/2012 | Zhang et al. | 451/36 |
| 2012/0107604 A1* | 5/2012 | Aruga | B82Y 30/00 428/328 |
| 2012/0129346 A1* | 5/2012 | Ryuzaki et al. | 438/693 |
| 2013/0037103 A1* | 2/2013 | Nakano | C09D 123/0892 136/256 |
| 2013/0252426 A1* | 9/2013 | Hoshi et al. | 438/692 |
| 2013/0295450 A1* | 11/2013 | Kakeya | H01M 4/366 429/206 |
| 2014/0170852 A1* | 6/2014 | Noller et al. | 438/692 |

FOREIGN PATENT DOCUMENTS

| | | |
|---|---|---|
| JP | 8-22970 | 1/1996 |
| JP | 8-67867 | 3/1996 |
| JP | 10-106994 | 4/1998 |
| JP | 2001-200243 A | 7/2001 |
| JP | 2005-244229 A | 9/2005 |
| JP | 2009-290188 | 12/2009 |
| JP | 2010-153781 A | 7/2010 |
| JP | 2010-153782 A | 7/2010 |
| JP | 2012-011525 | 1/2012 |
| JP | 2012-11526 | 1/2012 |
| WO | WO 02/067309 A1 | 8/2002 |
| WO | 2009/077412 A2 | 6/2009 |

* cited by examiner

CMP POLISHING FLUID, METHOD FOR MANUFACTURING SAME, METHOD FOR MANUFACTURING COMPOSITE PARTICLE, AND METHOD FOR POLISHING BASE MATERIAL

TECHNICAL FIELD

The present invention relates to a CMP polishing liquid, a method for manufacturing the same, a method for manufacturing a composite particle, and a method for polishing a base material by using the CMP polishing liquid. In particular, the present invention relates to a CMP polishing liquid, a method for manufacturing the same, a method for manufacturing a composite particle, and a method for polishing a base material by using the CMP polishing liquid, that are used for a process of flattening a surface to be polished of a base material, which is a technique for producing semiconductor devices. More specifically, the present invention relates to a CMP polishing liquid, a method for manufacturing the same, a method for manufacturing a composite particle, and a method for polishing a base material by using the CMP polishing liquid, that are used in a process of flattening a shallow trench isolation insulating film, a pre-metal insulating film, and an interlayer insulating film, for example.

BACKGROUND ART

In the recent processes for production of semiconductor devices, the importance of processing techniques for density enhancement and micronization is ever increasing. As one of such processing techniques, a chemical mechanical polishing (CMP) technique is an essential technique for formation of shallow trench isolation (STI), the flattening of pre-metal insulating films or interlayer insulating films, formation of plugs, and formation of embedded metal wirings, for example, in a process for producing semiconductor devices.

Most commonly used as a CMP polishing liquid is a silica-based CMP polishing liquid containing silica (silicon oxide) particles such as fumed silica or colloidal silica as abrasive particles. A feature of the silica-based CMP polishing liquid is its high versatility, and a wide range of types of films regardless of whether it is an insulating film or a conductive film can be polished when the content of abrasive particles, pH, and additives, for example, are appropriately selected.

Meanwhile, there is a growing demand for a CMP polishing liquid containing cerium compound particles as abrasive particles to be used mainly for insulating films such as silicon oxide films. For example, with a cerium oxide-based CMP polishing liquid containing cerium oxide (ceria) particles as abrasive particles, even if the content of abrasive particles is smaller than that of the silica-based CMP polishing liquid, a silicon oxide film can be polished at a high rate (e.g., see Patent Literatures 1 and 2 below).

In addition, a CMP polishing liquid using tetravalent metal element hydroxide particles as abrasive particles has been studied and a technique thereof is disclosed in Patent Literature 3 below. This technique takes advantage of a chemical action of the tetravalent metal element hydroxide particles and minimizes a mechanical action, thereby achieving a decrease in polishing scratches caused by the abrasive particles and an increase in polishing rate at the same time.

CITATION LIST

Patent Literature

[Patent Literature 1] Japanese Patent Application Laid-Open Publication No. H10-106994
[Patent Literature 2] Japanese Patent Application Laid-Open Publication No. H08-022970
[Patent Literature 3] International Patent Publication No. WO 02/067309

SUMMARY OF INVENTION

Technical Problem

However, a further increased polishing rate for insulating films is now required of the CMP polishing liquid in comparison to conventional CMP polishing liquids. To increase the polishing rate, various additives are generally added to the CMP polishing liquid, but there are limitations to such an approach.

To solve such a technical problem, the present invention aims to provide a CMP polishing liquid that makes it possible to increase the polishing rate for insulating films, a method for manufacturing the CMP polishing liquid, a method for manufacturing a composite particle, and a method for polishing a base material by using the CMP polishing liquid.

Solution to Problem

To solve the above-described problem, the inventors of the present invention have conducted studies on further improving the polishing characteristics that the abrasive particle itself has, and have thought of using a composite particle containing a specific component as an abrasive particle to complete the present invention.

More specifically, a CMP polishing liquid of the present invention is a CMP polishing liquid containing water and an abrasive particle, wherein the abrasive particle comprises a composite particle having a core including a first particle, and a second particle provided on the core, the first particle contains silica, the second particle contains cerium hydroxide, and the pH of the CMP polishing liquid is equal to or lower than 9.5.

With the CMP polishing liquid of the present invention, it is possible to increase the polishing rate for insulating films (e.g., silicon oxide films) in comparison to conventional CMP polishing liquids. In particular, with the CMP polishing liquid of the present invention, it is possible to significantly increase the polishing rate for insulating films in comparison to a conventional CMP polishing liquid in which silica particle or cerium oxide particle is exclusively used as an abrasive particle, or a CMP polishing liquid in which these particles are simply mixed and used. Furthermore, with the CMP polishing liquid of the present invention, in a CMP technique for flattening a shallow trench isolation insulating film, a pre-metal insulating film, and an interlayer insulating film, for example, it is possible to polish these films at a high rate. With the CMP polishing liquid of the present invention, it is possible to increase the polishing rate for insulating films and also polish insulating films with fewer polishing scratches.

In addition, the present invention relates to use of the CMP polishing liquid in a polishing method for polishing a surface to be polished that contains silicon oxide. In other words, it is preferable that the CMP polishing liquid of the present invention be used to polish a surface to be polished that contains silicon oxide.

A method for polishing a base material of the present invention comprises a step of polishing a surface to be polished of a base material by using the CMP polishing liquid.

By the method thus configured, it is possible to increase the polishing rate for insulating films by using the CMP polishing liquid having the same composition as described above in comparison to the case of using conventional polishing liquids.

A method for manufacturing a CMP polishing liquid of the present invention is a method for manufacturing a CMP polishing liquid containing water and an abrasive particle, the method comprising a step of, in an aqueous solution that contains a first particle containing silica, a first component containing a precursor of cerium hydroxide, and a second component that is capable of reacting with the precursor to precipitate a second particle containing cerium hydroxide, precipitating the second particle by reacting the precursor and the second component to obtain a composite particle having a core including the first particle, and the second particle provided on the core, wherein the abrasive particle comprises the composite particle, and the pH of the CMP polishing liquid is equal to or lower than 9.5. By the method for manufacturing a CMP polishing liquid of the present invention, it is possible to obtain a CMP polishing liquid that exhibits an excellent polishing rate for insulating films.

In the method for manufacturing a CMP polishing liquid of the present invention, it is preferable that the composite particle be obtained by mixing a liquid containing the first particle and the first component with a liquid containing the second component. This makes it possible to obtain a CMP polishing liquid that exhibits a further excellent polishing rate for insulating films.

In the method for manufacturing a CMP polishing liquid of the present invention, it is preferable that the precursor be a tetravalent cerium salt and the second component be a basic compound. This makes it possible to easily obtain a CMP polishing liquid that exhibits a further excellent polishing rate for insulating films.

It is preferable that the method for manufacturing a CMP polishing liquid of the present invention further comprise a step of dispersing the composite particle in water. This makes it possible to obtain a CMP polishing liquid that exhibits a further excellent polishing rate for insulating films.

It is preferable that the method for manufacturing a CMP polishing liquid of the present invention further comprise a step of washing the composite particle. This makes it possible to suppress variations in the polishing rate for insulating films.

A method for manufacturing a composite particle of the present invention comprises a step of, in an aqueous solution that contains a first particle containing silica, a first component containing a precursor of cerium hydroxide, and a second component that is capable of reacting with the precursor to precipitate a second particle containing cerium hydroxide, precipitating the second particle by reacting the precursor and the second component to obtain a composite particle having a core including the first particle, and the second particle provided on the core. By the method for manufacturing a composite particle of the present invention, it is possible to obtain a composite particle preferred as an abrasive particle of a CMP polishing liquid that exhibits an excellent polishing rate for insulating films.

In the method for manufacturing a composite particle of the present invention, it is preferable that the composite particle be obtained by mixing a liquid containing the first particle and the first component with a liquid containing the second component. This makes it possible to obtain a composite particle further preferred as an abrasive particle of a CMP polishing liquid that exhibits an excellent polishing rate for insulating films.

In the method for manufacturing a composite particle of the present invention, it is preferable that the precursor be a tetravalent cerium salt and the second component be a basic compound. This makes it possible to easily obtain a composite particle further preferred as an abrasive particle of a CMP polishing liquid that exhibits an excellent polishing rate for insulating films.

Advantageous Effects of Invention

The present invention can provide a CMP polishing liquid that makes it possible to increase the polishing rate for insulating films, a method for manufacturing the CMP polishing liquid, a method for manufacturing a composite particle, and a method for polishing a base material by using the CMP polishing liquid. In particular, in a CMP technique for flattening a shallow trench isolation insulating film, a pre-metal insulating film, and an interlayer insulating film, for example, the present invention can provide a CMP polishing liquid that makes it possible to polish the insulating films at a high rate, a method for manufacturing the CMP polishing liquid, a method for manufacturing a composite particle, and a method for polishing a base material by using the CMP polishing liquid. Furthermore, the present invention can also provide a CMP polishing liquid that makes it possible to polish the insulating films with fewer polishing scratches while increasing the polishing rate for insulating films, a method for manufacturing the CMP polishing liquid, a method for manufacturing a composite particle, and a method for polishing a base material by using the CMP polishing liquid.

DESCRIPTION OF EMBODIMENTS

A CMP polishing liquid, a method for manufacturing the CMP polishing liquid, a method for manufacturing a composite particle, and a method for polishing a base material by using the CMP polishing liquid according to one embodiment of the present invention will now be described in detail.

<CMP Polishing Liquid>

The CMP polishing liquid of the present embodiment is a composition that comes in contact with a surface to be polished at the time of polishing. Specifically, the CMP polishing liquid of the present embodiment contains at least water and abrasive particles including composite particles. Each of indispensable components and components that can be optionally added will be described hereinafter.

(Abrasive Particles)

The CMP polishing liquid of the present embodiment contains composite particles containing silica and cerium hydroxide as abrasive particles. Such composite particles exhibit a higher polishing rate for insulating films than a CMP polishing liquid in which silica particles such as fumed silica or colloidal silica, cerium oxide particles, or particles of tetravalent metal element hydroxide such as cerium hydroxide, for example, are exclusively used or a CMP polishing liquid in which a plurality of types of particles are simply mixed and used.

The composite particles herein are defined to be those obtained by combining (e.g., adhering or fusing) together silica particles and cerium hydroxide particles to a degree in which they are not separated into the respective particles by simple dispersion treatment. For example, the composite particles are clearly distinguished from aggregated particles of silica particles and cerium hydroxide particles in a liquid obtained by adding mixed particles individually including silica particles and cerium hydroxide particles that are not combined together into a medium such as water.

The composite particles each have a core including a first particle, and a second particle provided on the core. The first particle is a particle containing silica (hereinafter, simply referred to as a "silica particle") and the second particle is a particle containing cerium hydroxide (hereinafter, simply referred to as a "cerium hydroxide particle"). The core may be a particle constructed of a single silica particle, or may be an aggregate of silica particles or a particle made of associated silica particles. The "cerium hydroxide" in the cerium hydroxide particle may be tetravalent cerium hydroxide ($Ce(OH)_4$), or may be a compound obtained by substituting a group other than OH group for part of OH group of tetravalent cerium hydroxide (e.g., $Ce(OH)_{4-n}X_n$, where n is an integer of 1 to 3 and X represents a group other than OH group).

In each of the composite particles, a cerium hydroxide particle may be provided on at least part of the surface of the core. In other words, a plurality of cerium hydroxide particles may be provided around the core so as to completely cover the core, or cerium hydroxide particles may be provided on the core so that part of the core is exposed. Each of the composite particles may be a particle having a core-shell structure that has a core, and a shell constructed of cerium hydroxide particles provided on the core. The cerium hydroxide particles may tightly adhere to surfaces of the silica particles, or may fuse with the surfaces of the silica particles. Note that in a particle having the core-shell structure, cerium hydroxide constituting a shell does not strictly have a particle shape, but it is assumed that such a particle is included in the "composite particles each having a core including a first particle, and a second particle provided on the core".

Silica particles used for composite particles are not particularly limited, specific examples include silica particles such as colloidal silica and fumed silica, and are preferably colloidal silica particles. Examples of the silica particles that can be used include silica particles without surface modification; silica particles whose surface hydroxy groups are modified with cationic, anionic, or nonionic groups, for example; silica particles whose surface hydroxy groups are replaced with alkoxy groups, for example.

To avoid an excessively low polishing rate, the lower limit of the average particle diameter of composite particles in the CMP polishing liquid is preferably 5 nm or more, more preferably 10 nm or more, further preferably 15 nm or more, particularly preferably 20 nm or more, extremely preferably 30 nm or more, and very preferably 40 nm or more. In addition, the upper limit of the average particle diameter of the composite particles is preferably 400 nm or less, more preferably 300 nm or less, further preferably 250 nm or less, particularly preferably 200 nm or less, and extremely preferably 150 nm or less from the viewpoint that an insulating film becomes less likely to be scratched.

In the composite particles included in the abrasive particles, it is preferable that the average particle diameter of the cerium hydroxide particles be smaller than the average particle diameter of the silica particles, for example. That is, it is preferable to satisfy "(Average particle diameter of silica particles)−(Average particle diameter of cerium hydroxide particles)>0". The average particle diameter of the silica particles is not particularly limited, but may be 10 to 350 nm, for example. The average particle diameter of the cerium hydroxide particles is not particularly limited, but is preferably 0.1 to 100 nm, for example. The upper limit of the average particle diameter of the cerium hydroxide particles is more preferably 80 nm or less, further preferably 50 nm or less, particularly preferably 20 nm or less, extremely preferably 10 nm or less, and very preferably smaller than 10 nm from the viewpoint of obtaining a more favorable polishing rate. The lower limit of the average particle diameter of the cerium hydroxide particles is more preferably 0.5 nm or more, and further preferably 1 nm or more from the viewpoint of easy manufacturing.

The average particle diameter of the composite particles, the average particle diameter of the cerium hydroxide particles, and the average particle diameter of the silica particles can be measured from an SEM image obtained by observation with a scanning electron microscope or a TEM image obtained by observation with a transmission electron microscope. For example, in an SEM image in which a plurality of particles are observed, a plurality of particles (e.g., 20 particles) are selected at random. On the particles thus selected, the particle diameter is measured on the basis of a scale displayed in the SEM image. The particle diameter can be determined as the square root of the product of the longest diameter of a particle and the diameter in the direction orthogonal to the longest diameter (biaxial average particle diameter). The average of a plurality of measurement values thus obtained is determined to be the average particle diameter of the particles.

More specifically, an appropriate amount of liquid containing particles to be measured is put in a container, and a chip obtained by cutting a wafer with patterned wiring into 2 cm squares is immersed in the container for about 30 seconds. The chip is then transferred into a container containing pure water and rinsed therein for about 30 seconds, and the chip is dried by blowing nitrogen. Subsequently, the chip is placed on a sample holder for SEM observation, an acceleration voltage of 10 kV is applied thereto, and the particles are observed at an appropriate magnification (e.g., 200000-fold magnification) and also an image thereof is taken. A plurality of particles (e.g., 20 particles) are selected at random from the image obtained.

Figure 1:
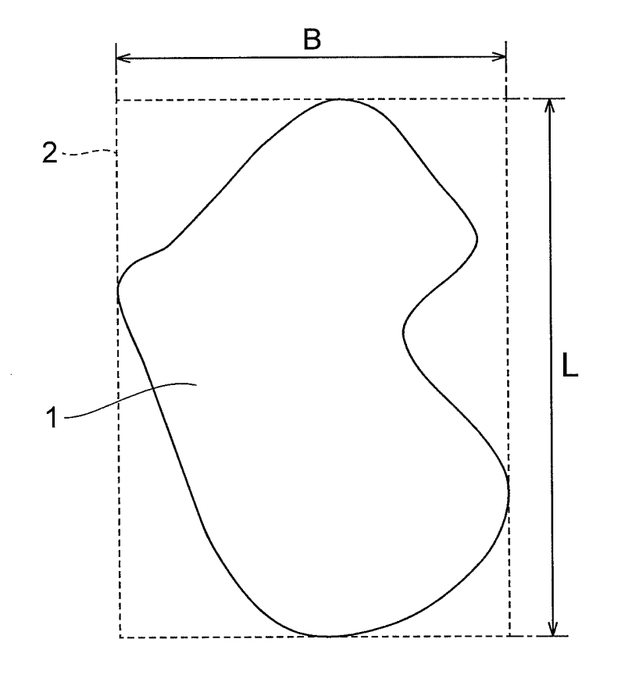
FIG. 1 is a diagram for explaining a method for calculating the average particle diameter of particles.

The particle diameter of each particle is then calculated. For example, when a particle selected is shaped as depicted in FIG. 1 in an SEM image, a circumscribing rectangle 2 that circumscribes a particle 1 and is disposed in such a manner that the length of the long side becomes the longest is determined. The biaxial average particle diameter of one particle is calculated as a value "$\sqrt{(L \times B)}$", where L is the length of the long side and B is the length of the short side. This operation is performed for each of 20 particles selected at random and the average of biaxial average particle diameters is determined to be the average particle diameter of the particles.

In the composite particles, there is a case in which surfaces of silica particles are covered with cerium hydroxide particles and shapes of the silica particles cannot be seen.

In this case, the average particle diameter of the silica particles can be determined by either of (1) a method for determining the average particle diameter by the above-described procedure from an SEM image obtained by observing silica particles of raw materials with a scanning electron microscope in a stage of preparing the composite particles, or (2) a method for, after measuring each of the average particle diameter ($R_1$) of the composite particles and the average particle diameter ($R_2$) of the cerium hydroxide particles from an SEM image obtained by observing the composite particles with a scanning electron microscope by the above-described procedure, determining the average particle diameter of the silica particles by a mathematical expression "$R_1-2R_2$" based on the assumption that surfaces of the silica particles are covered with a single layer of cerium hydroxide particles.

When the composite particles each have a core-shell structure, for example, the $R_2$ can be determined to be the average of thicknesses of a shell measured at four points that are selected at random for one particle from a TEM image.

The CMP polishing liquid of the present embodiment may contain as abrasive particles other types of particles (e.g., silica particles, cerium hydroxide particles, or alumina particles) that are different from the composite particles within an extent in which characteristics of the composite particles are not deteriorated. In this case, it is preferable that the content of the composite particles in the whole abrasive particles be high from the viewpoint of obtaining a further increased polishing rate. For example, the content of the composite particles is preferably 10 mass % or more, more preferably 20 mass % or more, further preferably 30 mass % or more, particularly preferably 40 mass % or more, and extremely preferably 50 mass % or more based on the whole abrasive particles.

The lower limit of the content of abrasive particles (when the abrasive particles include other types of particles that are different from the composite particles, the content of abrasive particles means the total content of the composite abrasive particles and other types of abrasive particles) is preferably 0.01 mass % or more, more preferably 0.05 mass % or more, and further preferably 0.1 mass % or more based on the total mass of the CMP polishing liquid from the viewpoint of obtaining a further favorable polishing rate. In addition, the upper limit of the content of the abrasive particles is preferably 20 mass % or less, more preferably 15 mass % or less, and further preferably 10 mass % or less based on the total mass of the CMP polishing liquid from the viewpoint of obtaining higher storage stability of the CMP polishing liquid.

(Additive)

The CMP polishing liquid of the present embodiment may further contain an additive. The "additive" herein means a substance other than water and abrasive particles contained in the CMP polishing liquid, for adjusting dispersibility of the composite particles, polishing properties, or storage stability, for example.

Examples of the additive include a water-soluble polymer, a carboxylic acid, an amino acid, an amphoteric surfactant, an anionic surfactant, a nonionic surfactant, and a cationic surfactant. These can be used singly or in combination of two or more kinds.

Out of these additives, the water-soluble polymer has an effect of enhancing the dispersibility of the composite particles and further increasing the polishing rate, and also has an effect of enhancing the flatness and the in-plane uniformity. It is assumed herein that the term "water-soluble" is used for a substance that dissolves in water in the amount of 0.1 g or more per 100 g of water.

The water-soluble polymer are not particularly limited, and specific examples thereof include polysaccharides such as alginic acid, pectinic acid, carboxymethyl cellulose, agar, cardlan, chitosan, chitosan derivatives, dextran, and pullulan; polycarboxylic acids and salts thereof such as polyaspartic acid, polyglutamic acid, polylysine, polymalic acid, polyamide acid, polymaleic acid, polyitaconic acid, polyfumaric acid, polyp-styrenecarboxylic acid), polyamide acid ammonium salts, polyamide acid sodium salts, and polyglyoxylic acid; vinyl polymers such as polyvinyl alcohol, polyvinylpyrrolidone, and polyacrolein; acrylic polymers obtained by polymerizing compositions containing acrylic monomers such as acrylic acid, methacrylic acid, acrylamide, and dimethylacrylamide as monomer components; and polyglycerin, polyethylene glycol, polyoxypropylene, polyoxyethylene-polyoxypropylene condensate, and a polyoxyethylene-polyoxypropylene block polymer of ethylenediamine. When the water-soluble polymer includes acidic substituents or basic substituents in the molecule, part of the respective substituents may constitute salts, and examples of the salts include ammonium salts, sodium salts, and potassium salts of acids.

Furthermore, a polyvinyl alcohol derivative obtained by introducing a functional group to the polyvinyl alcohol can be used. Examples of the polyvinyl alcohol derivative include reactive polyvinyl alcohols (e.g., product name: GOHSEFIMER Z, etc. manufactured by Nippon Synthetic Chemical Industry Co., Ltd., where GOHSEFIMER is a registered trademark), cationized polyvinyl alcohols (e.g., product name: GOHSEFIMER K, etc. manufactured by Nippon Synthetic Chemical Industry Co., Ltd.), anionized polyvinyl alcohols (e.g., product name: GOHSERAN L and GOHSENOL T, etc. manufactured by Nippon Synthetic Chemical Industry Co., Ltd., where GOHSERAN and GOHSENOL are registered trademarks), and hydrophilic group-modified polyvinyl alcohols (e.g., product name: ECOMATI (registered trademark), etc. manufactured by Nippon Synthetic Chemical Industry Co., Ltd.). Furthermore, a plurality of water-soluble polymers may be used together.

The carboxylic acid has an effect of stabilizing the pH. Specific examples of the carboxylic acid include formic acid, acetic acid, propionic acid, butyric acid, valeric acid, caproic acid, and lactic acid.

The amino acid has an effect of enhancing the dispersibility of the composite particles and further enhancing the polishing rate of an insulating film (e.g., silicon oxide film). Specific examples of the amino acid include arginine, lysine, aspartic acid, glutamic acid, asparagine, glutamine, histidine, proline, tyrosine, tryptophan, serine, threonine, glycine, alanine, β-alanine, methionine, cysteine, phenylalanine, leucine, valine, and isoleucine.

The amphoteric surfactant has an effect of enhancing the dispersibility of the composite particles and further enhancing the polishing rate of an insulating film (e.g., silicon oxide film). Specific examples of the amphoteric surfactant include betaine, β-alanine betaine, lauryl betaine, stearyl betaine, lauryldimethylamine oxide, 2-alkyl-N-carboxymethyl-N-hydroxyethylimidazolinium betaine, lauric acid amide propyl betaine, palm oil fatty acid amide propyl betaine, and lauryl hydroxy sulfobetaine. Among them, from the viewpoint of enhancing the dispersibility and stability, betaine, β-alanine betaine, and lauric acid amide propyl betaine are further preferred.

The anionic surfactant has an effect of adjusting the polishing property such as the flatness and the in-plane uniformity. Examples of the anionic surfactant include triethanolamine lauryl sulfate, ammonium lauryl sulfate, triethanolamine polyoxyethylene alkyl ether sulfate, and special polycarboxylic acid type polymeric dispersants.

The nonionic surfactant has an effect of adjusting the polishing property such as the flatness and the in-plane uniformity. Examples of the nonionic surfactant include polyoxyethylene lauryl ether, polyoxyethylene cetyl ether, polyoxyethylene stearyl ether, polyoxyethylene oleyl ether, polyoxyethylene higher alcohol ether, polyoxyethylene octyl phenyl ether, polyoxyethylene nonyl phenyl ether, polyoxyalkylene alkyl ether, polyoxyethylene derivatives, polyoxyethylene sorbitan monolaurate, polyoxyethylene sorbitan monopalmitate, polyoxyethylene sorbitan monostearate, polyoxyethylene sorbitan tristearate, polyoxyethylene sorbitan monooleate, polyoxyethylene sorbitan trioleate, tetraoleic acid polyoxyethylene sorbite, polyethylene glycol monolaurate, polyethylene glycol monostearate, polyethylene glycol distearate, polyethylene glycol monooleate, polyoxyethylene alkyl amine, polyoxyethylene hardened castor oil, 2-hydroxyethyl methacrylate, and alkyl alkanolamide.

The cationic surfactant has an effect of adjusting the polishing property such as the flatness and the in-plane uniformity. Examples of the cationic surfactant include coconut amine acetate and stearyl amine acetate.

When the CMP polishing liquid contains the above-described additives, it is preferable that the lower limit of the content of these additives (additive amount) be 0.01 mass % or more based on the total mass of the CMP polishing liquid from the viewpoint of further enhancing the dispersibility of abrasive particles, the polishing property, and the storage stability. It is preferable from the viewpoint of preventing sedimentation of the abrasive particles that the upper limit of the content of the additives be 20 mass % or less based on the total mass of the CMP polishing liquid.

(Water)

The CMP polishing liquid of the present embodiment contains water. The water is not particularly limited, but is preferred to be deionized water or ultrapure water. The content of water may be the remainder of the CMP polishing liquid other than the content of other components contained therein, and is not particularly limited.

(pH)

The pH of the CMP polishing liquid of the present embodiment is equal to or lower than 9.5 from the viewpoint that the storage stability of the CMP polishing liquid and the polishing rate are excellent. Setting the pH of the CMP polishing liquid equal to or lower than 9.5 can suppress aggregation of the abrasive particles. The pH of the CMP polishing liquid of the present embodiment is preferably 9.0 or less, more preferably 8.5 or less, further preferably 8.0 or less, particularly preferably 7.5 or less, and extremely preferably 7.0 or less from the viewpoint of obtaining the stability of the particle diameter of abrasive particles and an efficient polishing rate for insulating films. In addition, the pH of the CMP polishing liquid of the present embodiment is preferably 3.0 or more, more preferably 3.5 or more, further preferably 4.0 or more, particularly preferably 4.5 or more, and extremely preferably 5.0 or more from the viewpoint of obtaining an efficient polishing rate for insulating films.

The pH of the CMP polishing liquid can be adjusted by adding an acidic component such as phosphoric acid, hydrochloric acid, sulfuric acid, nitric acid, oxalic acid, and citric acid; or an alkali component such as ammonia, sodium hydroxide, potassium hydroxide, TMAH, and imidazole. Furthermore, to stabilize the pH, a buffer solution may be added to the CMP polishing liquid. Examples of the buffer solution include an acetate buffer solution and a phthalate buffer solution.

The pH of the polishing liquid can be measured with a pH meter (e.g., Model number: PHL-40, manufactured by Denki Kagaku Keiki Co., Ltd.). After performing a three-point calibration with standard buffer solutions (phthalate pH buffer solution of pH 4.01 (25° C.), neutral phosphate pH buffer solution of pH 6.86 (25° C.), borate pH buffer solution of pH 9.18 (25° C.)), the electrode is placed in the CMP polishing liquid (25° C.) for 2 minutes or longer, and the value after stabilization can be used as a pH measured value.

<Method for Manufacturing Composite Particles, Method for Manufacturing CMP Polishing Liquid>

A method for manufacturing a CMP polishing liquid of the present embodiment comprises a composite particle preparing step of preparing composite particles containing silica and cerium hydroxide. In addition, the method for manufacturing a CMP polishing liquid of the present embodiment optionally comprises a washing step, a dispersing step, and an abrasive-particle content adjusting step after the composite particle preparing step. Note that the order of the washing step and the dispersing step is not particularly limited, and each of the washing step and the dispersing step may be repeated a plurality of times.

At the composite particle preparing step, composite particles can be manufactured by a method for manufacturing a composite particle described below. At the composite particle preparing step, in an aqueous solution that contains silica particles, a first component (reactive component) containing a precursor of cerium hydroxide, and a second component that can react with the precursor to precipitate cerium hydroxide particles, the precursor and the second component are reacted to precipitate cerium hydroxide particles, whereby composite particles are obtained.

At the composite particle preparing step, for example, a precursor liquid (first liquid) containing the silica particles and the first component and a reaction liquid (second liquid) containing the second component are mixed, and the precursor in the first component and the second component are reacted, whereby the composite particles can be obtained. At the composite particle preparing step, the composite particles may be prepared by adding the second component into the precursor liquid containing the silica particles and the first component, or by adding the silica particles and the first component into the reaction liquid containing the second component.

Examples of the precursor of cerium hydroxide include a tetravalent cerium salt, and examples of the second component include a basic compound. It is preferable that the precursor of cerium hydroxide be a tetravalent cerium salt and also the reaction liquid be an alkali liquid that contains a basic compound as the second component.

As the tetravalent cerium salt, conventionally known ones can be used without any particular limitation, and examples thereof include $Ce(NO_3)_4$, $Ce(SO_4)_2$, $Ce(NH_4)_2(NO_3)_6$, and $Ce(NH_4)_4(SO_4)_4$.

As the alkali liquid, conventionally known ones can be used without any particular limitation. Examples of the basic compound in the alkali liquid include organic bases such as imidazole, tetramethylammonium hydroxide (TMAH), guanidine, triethylamine, pyridine, piperidine, pyrrolidine, and chitosan; and inorganic bases such as ammonia, potassium hydroxide, sodium hydroxide, and calcium hydroxide. Among these, ammonia and imidazole are preferred.

As the silica particles, the above-described silica particles can be used and, among those, colloidal silica particles are preferred.

The content of silica particles in the precursor liquid is preferably 0.1 mass % or more, more preferably 0.3 mass % or more, and further preferably 0.5 mass % or more based on the total mass of the precursor liquid from the viewpoint of productivity. From the viewpoint of preventing aggregation of the particles and further increasing the polishing rate, the content of the silica particles is preferably 20 mass % or less, more preferably 10 mass % or less, and further preferably 5 mass % or less based on the total mass of the precursor liquid.

In the precursor liquid, the concentration of the first component containing the precursor of cerium hydroxide is preferably 0.1 mass % or more and more preferably 0.5 mass % or more from the viewpoint of productivity. From the viewpoint of preventing aggregation of the particles and further increasing the polishing rate, the concentration of the first component is preferably 80 mass % or less and more preferably 70 mass % or less.

The concentration of the second component (e.g., basic component) in the reaction liquid (e.g., alkali liquid) is preferably 0.1 mass % or more and more preferably 0.3 mass % or more from the viewpoint of reducing the manufacturing time. From the viewpoint of further increasing the polishing rate, the concentration of the second component is preferably 50 mass % or less and more preferably 40 mass % or less.

Controlling the speed of mixing the precursor liquid and the reaction liquid can further increase the polishing rate. In the case of a mixing scale in which 2 liters of solution is stirred, the mixing speed is preferably equal to or higher than 0.5 mL/min, and is also preferably equal to or lower than 50 mL/min, for example.

In the case of a mixing scale in which a stirring blade with a total length of 4 cm is used to stir 2 liters of solution, the rotational speed of the stirring blade (stirring speed) is preferably 30 to 800 $min^{-1}$, for example. From the viewpoint of suppressing an excessive rise of the liquid level, the upper limit of the rotational speed is more preferably 700 $min^{-1}$ or less and further preferably 600 $min^{-1}$ or less.

The liquid temperature of an aqueous solution obtained by mixing the precursor liquid and the reaction liquid is preferably 0 to 70° C. in temperature in a reaction system that is read from a thermometer installed in the reaction system. From the viewpoint of preventing aggregation of the particles and further increasing the polishing rate, the liquid temperature of the aqueous solution is more preferably 40° C. or lower and further preferably 35° C. or lower. From the viewpoint of preventing the solution from freezing, the liquid temperature of the aqueous solution is preferably not lower than 0° C.

Alternatively, the composite particles can also be obtained by mixing a precursor liquid containing the first component with a reaction liquid containing the silica particles and the second component and reacting the precursor with the second component.

It is preferable that the method for manufacturing a CMP polishing liquid of the present embodiment further comprise a washing step of washing composite particles synthesized by the above-described method to remove metal impurities from the composite particles after the composite particle preparing step. For the washing of the composite particles, a method in which solid-liquid separation by centrifugation, for example, is repeated several times can be used, for example. The washing can be performed also in processes such as centrifugation, dialysis, ultrafiltration, and ion removal by an ion-exchange resin, for example.

When the composite particles thus obtained containing silica and cerium hydroxide are present in an aggregated state, it is preferable that the method for manufacturing a CMP polishing liquid of the present embodiment further comprise a dispersing step of dispersing the composite particles in water by an appropriate method. As a method of dispersing the composite particles in water as a main dispersion medium, as well as conventional dispersion treatment using a stirrer, mechanical dispersion using a homogenizer, an ultrasonic dispersing machine, or a wet ball mill, for example, can be used. For the method of dispersing and a method of controlling the particle diameter, methods described in Chapter 3 "Latest development trend and selection guidelines for various dispersing machines" of "Encyclopedia of Dispersion Technology" (Johokiko Co., Ltd., July 2005), for example, can be used. As the method of dispersing, a method in which a dispersion liquid containing composite particles is heated and the state is maintained can also be employed. More specifically, the composite particles can be dispersed by, for example, preparing a dispersion liquid in which the content of particles is about 50 mass % or less (preferably 1 to 20 mass %), maintaining the temperature of the dispersion liquid at 30 to 80° C. with a thermostatic bath, for example, and letting the dispersion liquid stand for 1 to 10 hours.

The method for manufacturing a CMP polishing liquid of the present embodiment may comprise an abrasive-particle content adjusting step of obtaining a storage solution for a polishing liquid after the washing step or the dispersing step. The "storage solution for a polishing liquid" herein is a solution that is diluted (2-fold or more, for example) with a liquid medium such as water at the time of use to adjust the content of abrasive particles and is used. Thereby, the content of abrasive particles can be easily adjusted depending on the types of films to be polished, and also storage and transportation are further facilitated.

The content of abrasive particles in the storage solution for a polishing liquid is adjusted to a content higher than the content of abrasive particles used as the CMP polishing liquid, and the storage solution for a polishing liquid is diluted with water to adjust the content of abrasive particles at a desired value at the abrasive-particle content adjusting step. The storage solution for a polishing liquid may be prepared at the washing step or the dispersing step, or may be prepared separately after the washing step or the dispersing step. Alternatively, in the method for manufacturing a CMP polishing liquid of the present embodiment, without performing the abrasive-particle content adjusting step, a slurry that is obtained at the composite particle preparing step, the washing step, or the dispersing step can be used for polishing without being processed.

The dilution factor of the storage solution for a polishing liquid is preferably 2-fold or more, more preferably 3-fold or more, further preferably 5-fold or more, and particularly preferably 10-fold or more because a higher dilution factor is more effective in reducing costs for preservation, transportation, and storage, for example. The upper limit of the dilution factor is not particularly limited, but is preferably 500-fold or less, more preferably 200-fold or less, further preferably 100-fold or less, and particularly preferably 50-fold or less because a higher dilution factor means a larger amount (higher content) of components contained in the storage solution for a polishing liquid, which tends to lower the stability during storage.

The CMP polishing liquid of the present embodiment can be obtained by mixing the above-described components at the respective steps described above. Additives that are the above-described components are mixed with abrasive particles at the dispersing step or the abrasive-particle content adjusting step, for example. It is preferable that the proportions of components constituting the CMP polishing liquid be adjusted so as to be the respective favorable contents for the components described above. Adjusting the proportions of the components constituting the CMP polishing liquid within the above-described ranges can further increase the polishing rate for insulating films.

In the method for manufacturing a CMP polishing liquid of the present embodiment, when obtaining the CMP polishing liquid, the pH of the CMP polishing liquid can be adjusted by using the above-described acidic components or the above-described alkali components. However, when the CMP polishing liquid has a desired pH, adjustment of the pH of the CMP polishing liquid using the above-described acidic components or the above-described alkali components is not required. Furthermore, when obtaining the CMP polishing liquid, the above-described buffer solutions may be added into the CMP polishing liquid.

<Method for Polishing Base Material>

Using the CMP polishing liquid described in the foregoing makes it possible to polish a film to be polished (e.g., insulating film) of a substrate having the film to be polished at an excellent polishing rate.

A method for polishing a base material of the present embodiment comprises at least a polishing step of polishing a surface to be polished of a base material by using the above-described CMP polishing liquid, and may also comprise a polishing liquid preparing step of preparing the CMP polishing liquid by the method for manufacturing a CMP polishing liquid of the present embodiment before the polishing step. At the polishing step, for example, in a state that a film to be polished of a base material having the film to be polished faces an abrasive cloth of a polishing platen and also the film to be polished is pressed against the abrasive cloth, at least a portion of the film to be polished is polished by relatively moving the base material and the polishing platen while feeding the CMP polishing liquid between the film to be polished and the abrasive cloth with a predetermined pressure applied to the back surface (surface on the other side of the surface to be polished) of the base material.

Examples of the base material to be polished include a substrate in which a film to be polished is formed on a substrate associated with the production of semiconductor devices (e.g., a semiconductor substrate on which a shallow trench isolation pattern, a gate pattern, a wiring pattern, or the like is formed). Examples of the film to be polished include an insulating film such as a silicon oxide film, and a polysilicon film, that are formed on such a pattern. The film to be polished may be a single film or may be a plurality of films. When a plurality of films are exposed at the surface to be polished, these can be considered as a film to be polished.

Polishing a film to be polished (e.g., an insulating film such as a silicon oxide film, or a polysilicon film) formed on such a substrate, with the CMP polishing liquid, can remove unevenness at a surface of the film to be polished, and can make the polished surface smooth over the entire area. It is preferable that the CMP polishing liquid of the present embodiment be used for polishing a surface to be polished containing silicon oxide.

When using a base material comprising an insulating film containing silicon oxide at least at a surface (e.g., silicon oxide film) and a polishing stoppage layer arranged underneath the insulating film, as a object to be polished, it is preferable that the polishing stoppage layer be a layer in which the polishing rate is lower than that in an insulating film (e.g., silicon oxide film) and specifically be a polysilicon film or a silicon nitride film, for example. Polishing is stopped when the polishing stoppage layer is exposed, whereby an insulating film (e.g., silicon oxide film) can be prevented from being excessively polished, and thus the flatness of the insulating film after being polished can be enhanced.

Examples of a method for producing a film to be polished that is polished with the CMP polishing liquid of the present embodiment include CVD methods represented by a low pressure CVD method, a sub atmospheric CVD method, and a plasma CVD method, for example, and a spin coating method in which a liquid raw material is applied onto a rotating substrate.

A silicon oxide film can be obtained through the low pressure CVD method in which monosilane ($SiH_4$) is thermally reacted with oxygen ($O_2$), for example. A silicon oxide film can be obtained through the sub atmospheric CVD method in which tetraethoxysilane ($Si(OC_2H_5)_4$) is thermally reacted with ozone ($O_3$), for example. As another example of the CVD methods, a silicon oxide film can be similarly obtained by causing a plasma reaction between tetraethoxysilane and oxygen.

A silicon oxide film can be obtained through the spin coating method in which a liquid raw material containing inorganic polysilazane or inorganic siloxane, for example, is applied on a substrate and is thermally cured in a furnace, for example.

Examples of a method for producing a polysilicon film include a low pressure CVD method in which monosilane is thermally reacted and a plasma CVD method in which a plasma reaction is caused with monosilane.

To stabilize the quality of films such as a silicon oxide film or a polysilicon film obtained by the above-described methods, a heat treatment may be performed at a temperature of 200° C. to 1000° C. if necessary. A silicon oxide film obtained by the above-described methods may contain trace amounts of boron (B), phosphorus (P), and carbon (C), for example, to enhance the embeddability.

In the polishing method of the present embodiment, as a polishing apparatus, for example, a general polishing apparatus can be used on which a motor capable of changing a rotational speed is mounted and that has a platen to which an abrasive cloth (pad) can be attached and a holder for holding a base material.

As the polishing cloth, general nonwoven cloth, foam, or a non-foamed product, for example, can be used, and examples of a material of the polishing cloth that can be used include resins such as polyurethane, acrylic resin, polyester, acrylic-ester copolymers, polytetrafluoroethylene, polypropylene, polyethylene, poly-4-methylpentene, cellulose, cellulose ester, polyamides such as nylon (registered trademark) and aramid, polyimide, polyimideamide, polysiloxane copolymers, oxirane compounds, phenolic resin, polystyrene, polycarbonate, epoxy resin, and porous fluorine resin. From the viewpoint of the polishing rate and the flatness, foamed polyurethane and non-foamed polyurethane are preferred as the material of the polishing cloth. It is preferable that the polishing cloth be grooved to accommodate the CMP polishing liquid.

The polishing conditions are not particularly limited, but it is preferable that the rotational speed of the platen be set at a low rotational speed equal to or lower than 200 $min^{-1}$ to prevent the base material from being ejected. The pressure applied to the base material that is pressed onto the polishing cloth (polishing pressure) is preferably 4 to 100 kPa, and from the viewpoint that the in-plane uniformity of the polished surface of the base material and the flatness of the pattern become excellent, it is more preferably 6 to 60 kPa.

While polishing is performed, the CMP polishing liquid may be continuously fed to the surface of the polishing cloth by a pump, for example. The amount of the CMP polishing liquid thus fed is not particularly limited, but it is preferable that the surface of the polishing cloth be always covered with the CMP polishing liquid.

After polishing is completed, it is preferable to wash the base material (e.g., semiconductor substrate) thoroughly under running water to remove particles adhering to the base material. For the washing, dilute hydrofluoric acid or aqueous ammonia may be used together other than pure water, and a brush may also be used together to increase the washing efficiency. Furthermore, after the washing, it is preferable to dry the base material after removing water droplets adhering to the base material with a spin dryer, for example.

The composite particles, the CMP polishing liquid, and the polishing method of the present embodiment can be favorably used for the formation of shallow trench isolation. To form the shallow trench isolation, it is preferable that the selected ratio of the polishing rate for the insulating film (film containing silicon oxide, e.g., silicon oxide film) with respect to the polishing stoppage layer (polishing rate for the insulating film/polishing rate for the polishing stoppage layer) be equal to or higher than 100. When the selected ratio is lower than 100, the magnitude of the polishing rate for the insulating film (film containing silicon oxide, e.g., silicon oxide film) with respect to the polishing rate for the polishing stoppage layer is small, and it tends to be difficult to stop the polishing at a predetermined position in forming the shallow trench isolation. When the selected ratio is equal to or higher than 100, it is easy to stop the polishing, which is further favorable for the formation of the shallow trench isolation. Furthermore, for the use for the formation of the shallow trench isolation, it is preferable that scratches be less likely to occur during the polishing.

The composite particles, the CMP polishing liquid, and the polishing method of the present embodiment can also be used for polishing a pre-metal insulating film. As a constituent material for the pre-metal insulating film, phosphorus-silicate glass or boron-phosphorus-silicate glass, for example, is used in addition to silicon oxide, and furthermore silicon oxyfluoride or amorphous carbon fluoride, for example, can also be used.

The composite particles, the CMP polishing liquid, and the polishing method of the present embodiment can be applied to a film other than an insulating film such as a silicon oxide film. Examples of such a film include high dielectric constant films of Hf-based oxide, Ti-based oxide, and Ta-based oxide, for example; semiconductor films of silicon, amorphous silicon, SiC, SiGe, Ge, GaN, GaP, GaAs, and an organic semiconductor, for example; a phase change film of GeSbTe, for example; an inorganic conductive film of ITO, for example; and polymer resin films of polyimide-based, polybenzoxazole-based, acrylic-based, epoxy-based, and phenol-based, for example.

The composite particles, the CMP polishing liquid, and the polishing method of the present embodiment can also be applied not only to film-like materials to be polished, but also to various substrates made of glass, silicon, SiC, SiGe, Ge, GaN, GaP, GaAs, sapphire, or plastics, for example.

The composite particles, the CMP polishing liquid, and the polishing method of the present embodiment can be used not only for manufacturing semiconductor devices, but also for manufacturing image display apparatuses such as TFTs and organic ELs; optical components such as photomasks, lenses, prisms, optical fibers, and monocrystalline scintillators; optical devices such as photoswitching devices and optical waveguides; light emitting devices such as solid lasers and blue laser LEDs; and magnetic memory apparatuses such as magnetic disks and magnetic heads.

EXAMPLES

The present invention will be described hereinafter in further detail with reference to examples, but the present invention is not limited to these examples.

Table 1 gives primary particle diameters, secondary particle diameters and degree of association of colloidal silica that were used in the examples (all in nominal values provided by the manufacturer).

TABLE 1

| Type of colloidal silica | Primary particle diameter (nm) | Secondary particle diameter (nm) | Degree of association |
|---|---|---|---|
| Silica Particle 1 | 35 | 56 | 1.6 |
| Silica Particle 2 | 35 | 57 | 1.6 |
| Silica Particle 3 | 35 | 61 | 1.7 |
| Silica Particle 4 | 31 | 69 | 2.2 |
| Silica Particle 5 | 55 | 100 | 1.8 |
| Silica Particle 6 | 34 | 62 | 1.8 |
| Silica Particle 7 | 44 | 68 | 1.5 |
| Silica Particle 8 | 12 | 17 | 1.4 |

Experiment 1

Influence of Composite Particles

Manufacturing methods and characteristics of a CMP polishing liquid that contains composite particles containing silica and cerium hydroxide (hereinafter, referred to as "silica/cerium hydroxide composite particles"), a CMP polishing liquid that contains exclusively either ones of silica particles and cerium hydroxide particles, and a CMP polishing liquid in which silica particles and cerium hydroxide particles are simply mixed will be described in Example 1 and Comparative Examples 1 to 3.

Example 1

Synthesis Example 1

Synthesis of Silica/Cerium Hydroxide Composite Particles 100 g of $Ce(NH_4)_2(NO_3)_6$ was dissolved in 5000 g of pure water. Then, this solution was mixed with 190 g of colloidal silica dispersion liquid (silica particle content: 20 mass %) of Silica Particle 1 and was stirred, whereby a precursor liquid was obtained. In the precursor liquid, $Ce(NH_4)_2(NO_3)_6$ was dissolved in water and the silica particles were dispersed in water. The content of the silica particles contained in the precursor liquid was 0.7 mass % based on the total mass of the precursor liquid. Subsequently, while the temperature of the precursor liquid was being adjusted to 20° C. and the precursor liquid was being stirred at 250 min$^{-1}$ with a stirrer, 130 g of aqueous ammonia (10 mass % aqueous solution) was dropped into the precursor liquid at a mixing rate of 10 mL/min, whereby yellowish-white particles were generated.

The liquid thus obtained was centrifuged (at 3000 min$^{-1}$ for 5 minutes), the supernatant liquid was removed by decantation, and solids were taken out. An appropriate amount of pure water was added thereto so that the content of the solids became about 10 mass % (the amount of pure water added could be calculated on the assumption that all raw materials had reacted), and then dispersion treatment of the solids was performed in a thermostatic bath at 60° C. for 4 hours, whereby a dispersion liquid 1 of particles A was obtained. This dispersion liquid 1 was filtered by ultrafiltration to wash the particles A, and a dispersion liquid 2 of the particles A was obtained.

When part of the particles A thus obtained were extracted and observed with a TEM, "composite particles" in which a number of fine particles having particle diameters (represented as a biaxial average particle diameter, the same applies hereinafter in the present example) of about 2 to 6 nm (the average particle diameter is considered to be in a range of 2 to 6 nm, the same applies hereinafter) adhered around particles having particle diameters of about 35 to 60 nm (the average particle diameter is considered to be in a range of 35 to 60 nm, the same applies hereinafter) and "single particles" having particle diameters of about 2 to 6 nm that were separately present (this means that the particles were not composited, unlike the composite particles; the same applies hereinafter) were observed. In the "composite particles", the surfaces of the particles having particle diameters of about 35 to 60 nm each had a portion to which fine particles adhered and a portion to which fine particles did not adhere.

From the particle diameters seen in the TEM image, it is considered that the fine particles having particle diameters of about 2 to 6 nm are cerium hydroxide particles and the particles having particle diameters of about 35 to 60 nm are silica particles. Accordingly, it is considered that the "composite particles" are "silica/cerium hydroxide composite particles" in which cerium hydroxide particles adhere around silica particles, the single particles are "single particles of cerium hydroxide", and the particles A are mixed-particles of "silica/cerium hydroxide composite particles" and "single particles of cerium hydroxide".

[Preparation of Storage Solution for Polishing Liquid and CMP Polishing Liquid]

An appropriate amount of the dispersion liquid 2 of the particles A was weighed, and was heated to remove water. The mass of the remaining solids was measured to determine the content of the particles A in the dispersion liquid 2 of the particles A.

Subsequently, the content of the particles A was adjusted to 2.0 mass % by adding pure water to the dispersion liquid 2 of the particles A, whereby a storage solution for a polishing liquid (corresponding to 1.0 mass % as silica particles, corresponding to 1.0 mass % as cerium hydroxide particles) was prepared. The storage solution for a polishing liquid was 2-fold diluted with pure, water to adjust the content of the particles A to 1.0 mass %, whereby a CMP polishing liquid was prepared.

In the CMP polishing liquid thus obtained, the average particle diameter of "silica/cerium hydroxide composite particles" measured was 66 nm. The pH of the CMP polishing liquid measured was 3.4. The pH of the CMP polishing liquid and the average particle diameter of the composite particles were measured by the following methods.

(pH Measurement)
Measurement temperature: 25±5° C.
pH: measured with PHL-40 (model number) manufactured by Denki Kagaku Keiki Co., Ltd.

(Average Particle Diameter Measurement)

An appropriate amount of the CMP polishing liquid was put in a container, and a chip obtained by cutting a wafer with patterned wiring into 2 cm squares was immersed in the container for about 30 seconds. The chip was then transferred into a container containing pure water and rinsed therein for about 30 seconds, and the chip was dried by blowing nitrogen. Subsequently, the chip was placed on a sample holder for SEM observation, an acceleration voltage of 10 kV was applied thereto, and the particles were observed at 200000-fold magnification and also a plurality of images thereof was taken, with a scanning electron microscope (Product name: S-4800, manufactured by Hitachi High-Technologies Corporation). From the images obtained, 20 particles to be measured were selected at random. The biaxial average particle diameter of each of the particles selected was determined on the basis of a scale displayed in the SEM images. The average of biaxial average particle diameters thus obtained was determined to be the average particle diameter of the particles.

[Polishing of Substrate]

A Substrate having a silicon oxide layer was polished with the CMP polishing liquid under the following conditions.

(CMP Polishing Conditions)

Polishing apparatus: Product name: Mirra, manufactured by APPLIED MATERIALS, Inc.

Flow rate of CMP polishing liquid: 200 mL/min

Substrate to be polished: Silicone substrate having the main surface of which a silicon oxide layer (SiO$_2$ layer) having a thickness of 1000 nm was entirely formed Polishing cloth: Foamed polyurethane resin having closed cells (Model number: IC 1000, manufactured by Rohm and Haas Japan K.K.)

Polishing pressure: 15.7 kPa (2 psi)

Relative speed between substrate and polishing platen: 80 m/min

Polishing Time: 1 min/piece

Washing: After the CMP process, washing with ultrasonic water was performed, and drying was performed with a spin dryer.

[Evaluation of Polished Product: Polishing Rate]

The polishing rate for the silicon oxide layer (SiO$_2$RR) of the substrate that was polished and washed under the above-described polishing conditions was determined. Specifically, the difference in film thickness of the silicon oxide layer between before and after the polishing was measured with an optical interference-type film thickness measuring device, and it was determined according to the following formula.

(SiO$_2$RR)=(Difference in film thickness of silicon oxide layer between before and after polishing (Å))/(Polishing time (min))

The polishing rate for the silicon oxide layer with the CMP polishing liquid was determined as described above, and the result was 535 Å/min.

Comparative Example 1

Synthesis Example 2

Synthesis of Cerium Hydroxide Particles

The same operation as in Synthesis Example 1 was performed except that Silica Particle 1 was not added. Specifically, 100 g of $Ce(NH_4)_2(NO_3)_6$ was dissolved in 5000 g of pure water, whereby a precursor liquid was obtained. Subsequently, while the temperature of the precursor liquid was being adjusted to 20° C. and the precursor liquid was being stirred at 250 $min^{-1}$ with a stirrer, 130 g of aqueous ammonia (10 mass % aqueous solution) was dropped into the precursor liquid at a mixing rate of 10 mL/min, whereby yellowish-white particles were generated.

The liquid thus obtained was centrifuged (at 3000 $min^{-1}$ for 5 minutes), the supernatant liquid was removed by decantation, and solids were taken out. An appropriate amount of pure water was added thereto so that the content of the solids became about 10 mass %, and then dispersion treatment of the solids was performed in a thermostatic bath at 60° C. for 4 hours, whereby a dispersion liquid 1 of particles B was obtained. This dispersion liquid 1 was filtered by ultrafiltration to wash the particles B, and a dispersion liquid 2 of the particles B was obtained.

When part of the particles B thus obtained were extracted and observed with the TEM, "single particles" having particle diameters of about 4 to 12 nm that were separately present were observed. The single particles were "single particles of cerium hydroxide".

[Preparation of Storage Solution for Polishing Liquid and CMP Polishing Liquid]

An appropriate amount of the dispersion liquid 2 of the particles B was weighed, and was heated to remove water. The mass of the remaining solids was measured to determine the content of the particles B in the dispersion liquid 2 of the particles B.

A storage solution for a polishing liquid in which the content of the particles B (cerium hydroxide particles) was 1.0 mass % was prepared by adding pure water to the dispersion liquid 2 of the particles B. The storage solution for a polishing liquid was 2-fold diluted with pure water, whereby a CMP polishing liquid containing cerium hydroxide particles of 0.5 mass % and water of 99.5 mass % was prepared.

With respect to this CMP polishing liquid, the pH of the CMP polishing liquid and the average particle diameter of cerium hydroxide particles were measured by the same operation as in Example 1. The pH was 3.0, and the average particle diameter was 8 nm. The polishing rate for the silicon oxide layer with the CMP polishing liquid was also determined by the same operation as in Example 1, and the result was 88 Å/min.

Comparative Example 2

2.5 mass % of the colloidal silica dispersion liquid (silica particle content: 20 mass %) of Silica Particle 1 (corresponding to 0.5 mass % as silica particles) and 97.5 mass % of water were mixed, and the pH was adjusted to 3.4 with 1% nitric acid aqueous solution, whereby a CMP polishing liquid containing silica particles of 0.5 mass % was prepared.

With respect to this CMP polishing liquid, the average particle diameter of silica particles was measured by the same operation as in Example 1, and the average particle diameter was 56 nm. The polishing rate for the silicon oxide layer with the CMP polishing liquid was also determined by the same operation as in Example 1, and the result was 65 Å/min.

Comparative Example 3

2.5 mass % of the colloidal silica dispersion liquid (silica particle content: 20 mass %) of Silica Particle 1 (corresponding to 0.5 mass % as silica particles), 0.5 mass % of the cerium hydroxide particles prepared in Synthesis Example 2, and 97 mass % of water were mixed, whereby a CMP polishing liquid containing silica particles and cerium hydroxide particles each of 0.5 mass % was prepared.

With respect to this CMP polishing liquid, the pH of the CMP polishing liquid was measured by the same operation as in Example 1, and the pH was 3.5. The polishing rate for the silicon oxide layer with the CMP polishing liquid was also determined by the same operation as in Example 1, and the result was 54 Å/min.

Example 1 and Comparative Examples 1 to 3 described above were given in Table 2.

TABLE 2

| | First particle | Second particle | State of abrasive particle | Abrasive particle content (mass %) | Silica particle content (mass %) | Cerium hydroxide particle content (mass %) | Average particle diameter (nm) | pH | $SiO_2$RR (Å/min) |
|---|---|---|---|---|---|---|---|---|---|
| Example 1 | Silica Particle 1 | Cerium hydroxide particle | Mixed- particle of composite particle and single particle | 1.0 | 0.5 | 0.5 | (Composite particle) 66 | 3.4 | 535 |
| Comparative Example 1 | — | Cerium hydroxide particle | Single particle | 0.5 | — | 0.5 | (Single particle) 8 | 3.0 | 88 |
| Comparative Example 2 | Silica Particle 1 | — | Single particle | 0.5 | 0.5 | — | (Single particle) 56 | 3.4 | 65 |
| Comparative Example 3 | Silica Particle 1 | Cerium hydroxide particle | Mixed- particles of two types of single particle | 1.0 | 0.5 | 0.5 | — | 3.5 | 54 |

As is obvious from Table 2, the polishing rate for the silicon oxide layer significantly increased by using CMP polishing liquids containing the "silica/cerium hydroxide composite particles". Specifically, in the comparison of Example 1 and Comparative Examples 1 to 3, the CMP polishing liquid containing the "silica/cerium hydroxide composite particles" was more excellent in polishing rate than the CMP polishing liquid containing exclusively silica particles or cerium hydroxide particles and the CMP polishing liquid in which silica particles and cerium hydroxide particles were simply mixed.

Experiment 2

Influence of pH

Influences of the pH were studied in a CMP polishing liquid containing "silica/cerium hydroxide composite particles".

Example 2

The storage solution for a polishing liquid obtained in Example 1 above (the content of particles A: 2.0 mass %) was diluted with water and also the pH was adjusted to 5.8 with 10 mass % imidazole aqueous solution, whereby a CMP polishing liquid containing mixed-particles of composite particles and single particles as abrasive particles in a total content of 0.2 mass % (corresponding to one obtained by 10-fold diluting the storage solution for a polishing liquid) was prepared.

With respect to this CMP polishing liquid, the average particle diameter of composite particles was measured by the same operation as in Example 1, and the average particle diameter was 67 nm. The polishing rate for the silicon oxide layer with the CMP polishing liquid was also determined by the same operation as in Example 1, and the result was 2721 Å/min.

Example 3

The storage solution for a polishing liquid obtained in Example 1 above (the content of particles A: 2.0 mass %) was diluted with water and also the pH was adjusted to 8.3 with 10 mass % imidazole aqueous solution, whereby a CMP polishing liquid containing mixed-particles of composite particles and single particles as abrasive particles in a total content of 0.2 mass % (corresponding to one obtained by 10-fold diluting the storage solution for a polishing liquid) was prepared.

With respect to this CMP polishing liquid, the average particle diameter of composite particles was measured by the same operation as in Example 1, and it was 69 nm. The polishing rate for the silicon oxide layer with the CMP polishing liquid was also determined by the same operation as in Example 1, and the result was 1258 Å/min.

Comparative Example 4

The storage solution for a polishing liquid obtained in Example 1 above (the content of particles A: 2.0 mass %) was diluted with water and also the pH was adjusted to 9.8 with 0.1 mass % potassium hydroxide aqueous solution, whereby a CMP polishing liquid containing mixed-particles of composite particles and single particles as abrasive particles in a total content of 0.2 mass % (corresponding to one obtained by 10-fold diluting the storage solution for a polishing liquid) was prepared.

With respect to this CMP polishing liquid, the average particle diameter of composite particles was not measured because aggregation of the particles was observed at a pH near 9.5 during the adjustment of the pH. The polishing rate for the silicon oxide layer with the CMP polishing liquid was also determined by the same operation as in Example 1, and the result was 255 Å/min.

Examples 2 to 3 and Comparative Example 4 described above are given in Table 3.

TABLE 3

| | First particle | Second particle | State of abrasive particle | Abrasive particle content (mass %) | Silica particle content (mass %) | Cerium hydroxide particle content (mass %) | Average particle diameter (nm) | pH | SiO$_2$RR (Å/min) |
|---|---|---|---|---|---|---|---|---|---|
| Example 2 | Silica Particle 1 | Cerium hydroxide particle | Mixed-particle of composite particle and single particle | 0.2 | 0.1 | 0.1 | (Composite particle) 67 | 5.8 | 2721 |
| Example 3 | Silica Particle 1 | Cerium hydroxide particle | | 0.2 | 0.1 | 0.1 | (Composite particle) 69 | 8.3 | 1258 |
| Comparative Example 4 | Silica Particle 1 | Cerium hydroxide particle | | 0.2 | 0.1 | 0.1 | — | 9.8 | 255 |

As is obvious from Table 3, the polishing rate for the silicon oxide layer significantly increased by adjusting the pH of the CMP polishing liquids containing the "silica/cerium hydroxide composite particles".

Experiment 3

Influence of Difference in Silica Type

Different types of silica particles were used to synthesize "silica/cerium hydroxide composite particles", and characteristics of the CMP polishing liquid having the pH adjusted to about 6 were studied.

Example 4

Synthesis Example 3

Synthesis of Silica/Cerium Hydroxide Composite Particles 100 g of Ce(NH$_4$)$_2$(NO$_3$)$_6$ was dissolved in 5000 g of pure water. Then, this solution was mixed with 380 g of colloidal silica dispersion liquid (silica particle content: 20 mass %) of Silica Particle 1 and was stirred, whereby a precursor liquid was obtained. The content of the silica particles contained in the precursor liquid was 1.4 mass % based on the total mass of the precursor liquid. Subsequently, while the temperature of the precursor liquid was being adjusted to 20° C. and the precursor liquid was being stirred at 250 $min^{-1}$ with a stirrer, 520 g of imidazole aqueous solution (10 mass % aqueous solution) was dropped into the precursor liquid at a mixing rate of 10 mL/min, whereby yellowish-white particles were precipitated.

The liquid thus obtained was centrifuged (at 3000 $min^{-1}$ for 5 minutes), the supernatant liquid was removed by decantation, and solids were taken out. An appropriate amount of pure water was added thereto so that the content of the solids became about 10 mass %, and then dispersion treatment of the solids was performed in a thermostatic bath at 60° C. for 4 hours, whereby a dispersion liquid 1 of particles C was obtained. This dispersion liquid 1 was filtered by ultrafiltration to wash the particles C, and a dispersion liquid 2 of the particles C was obtained.

When the particles C thus obtained were observed with the TEM, "composite particles" in which a number of fine particles having particle diameters of about 2 to 6 nm adhered around particles having particle diameters of about 35 to 60 nm and "single particles" having particle diameters of about 2 to 6 nm that were present separately were observed. In the "composite particles", the surfaces of the particles having particle diameters of about 35 to 60 nm each had a portion to which fine particles adhered and a portion to which fine particles did not adhere.

[Preparation of Storage Solution for Polishing Liquid and CMP Polishing Liquid]

An appropriate amount of the dispersion liquid 2 of the particle C was weighed, and was heated to remove water. The mass of the remaining solids was measured to determine the content of the particles C in the dispersion liquid 2 of the particles C.

Subsequently, the content of the particles C was adjusted to 2.0 mass % by adding pure water to the dispersion liquid 2 of the particles C, whereby a storage solution for a polishing liquid (corresponding to 1.33 mass % as silica particles, corresponding to 0.67 mass % as cerium hydroxide particles) was obtained. The storage solution for a polishing liquid was then diluted with water and also the pH was adjusted to 6.1 with 10 mass % imidazole aqueous solution, whereby a CMP polishing liquid containing mixed-particles of composite particles and single particles as abrasive particles in a content of 0.2 mass % (corresponding to one obtained by 10-fold diluting the storage solution for a polishing liquid) was prepared.

With respect to this CMP polishing liquid, the average particle diameter of composite particles was measured by the same operation as in Example 1, and the average particle diameter was 67 nm. The polishing rate for the silicon oxide layer with the CMP polishing liquid was also determined by the same operation as in Example 1, and the result was 3311 Å/min.

Example 5

A CMP polishing liquid containing mixed-particles of composite particles and single particles as abrasive particles in a content of 0.2 mass % was prepared by the same method as in Example 4 except using a colloidal silica dispersion liquid (silica particle content: 20 mass %) of Silica Particle 2 in place of the colloidal silica dispersion liquid of Silica Particle 1 and adjusting the pH to 6.0.

With respect to this CMP polishing liquid, the average particle diameter of composite particles was measured by the same operation as in Example 1, and the average particle diameter was 66 nm. The polishing rate for the silicon oxide layer with the CMP polishing liquid was also determined by the same operation as in Example 1, and the result was 3866 Å/min.

Example 6

A CMP polishing liquid containing mixed-particles of composite particles and single particles as abrasive particles in a content of 0.2 mass % was prepared by the same method as in Example 4 except using a colloidal silica dispersion liquid (silica particle content: 20 mass %) of Silica Particle 3 in place of the colloidal silica dispersion liquid of Silica Particle 1 and adjusting the pH to 6.3.

With respect to this CMP polishing liquid, the average particle diameter of composite particles was measured by the same operation as in Example 1, and the average particle diameter was 64 nm. The polishing rate for the silicon oxide layer with the CMP polishing liquid was also determined by the same operation as in Example 1, and the result was 3680 Å/min.

Example 7

A CMP polishing liquid containing mixed-particles of composite particles and single particles as abrasive particles in a content of 0.2 mass % was prepared by the same method as in Example 4 except using a colloidal silica dispersion liquid (silica particle content: 20 mass %) of Silica Particle 4 in place of the colloidal silica dispersion liquid of Silica Particle 1 and adjusting the pH to 6.2.

With respect to this CMP polishing liquid, the average particle diameter of composite particles was measured by the same operation as in Example 1, and the average particle diameter was 72 nm. The polishing rate for the silicon oxide layer with the CMP polishing liquid was also determined by the same operation as in Example 1, and the result was 2388 Å/min.

Example 8

A CMP polishing liquid containing mixed-particles of composite particles and single particles as abrasive particles in a content of 0.2 mass % was prepared by the same method as in Example 4 except using a colloidal silica dispersion liquid (silica particle content: 20 mass %) of Silica Particle 5 in place of the colloidal silica dispersion liquid of Silica Particle 1 and adjusting the pH to 6.1.

With respect to this CMP polishing liquid, the average particle diameter of composite particles was measured by the same operation as in Example 1, and the average particle diameter was 109 nm. The polishing rate for the silicon oxide layer with the CMP polishing liquid was also determined by the same operation as in Example 1, and the result was 3796 Å/min.

Example 9

A CMP polishing liquid containing mixed-particles of composite particles and single particles as abrasive particles in a content of 0.2 mass % was prepared by the same method as in Example 4 except using a colloidal silica dispersion liquid (silica particle content: 20 mass %) of Silica Particle 6 in place of the colloidal silica dispersion liquid of Silica Particle 1 and adjusting the pH to 6.0.

With respect to this CMP polishing liquid, the average particle diameter of composite particles was measured by the same operation as in Example 1, and the average particle diameter was 66 nm. The polishing rate for the silicon oxide layer with the CMP polishing liquid was also determined by the same operation as in Example 1, and the result was 4896 Å/min.

Example 10

A CMP polishing liquid containing mixed-particles of composite particles and single particles as abrasive particles in a content of 0.2 mass % was prepared by the same method as in Example 4 except using a colloidal silica dispersion liquid (silica particle content: 20 mass %) of Silica Particle 7 in place of the colloidal silica dispersion liquid of Silica Particle 1 and adjusting the pH to 5.7.

With respect to this CMP polishing liquid, the average particle diameter of composite particles was measured by the same operation as in Example 1, and the average particle diameter was 76 nm. The polishing rate for the silicon oxide layer with the CMP polishing liquid was also determined by the same operation as in Example 1, and the result was 3034 Å/min.

Example 11

A CMP polishing liquid containing mixed-particles of composite particles and single particles as abrasive particles in a content of 0.2 mass % was prepared by the same method as in Example 4 except using 633 g of colloidal silica dispersion liquid (silica particle content: 12 mass %) of Silica Particle 8 in place of the colloidal silica dispersion liquid of Silica Particle 1 and using 4750 g of pure water and adjusting the pH to 5.8.

With respect to this CMP polishing liquid, the average particle diameter of composite particles was measured by the same operation as in Example 1, and the average particle diameter was 21 nm. The polishing rate for the silicon oxide layer with the CMP polishing liquid was also determined by the same operation as in Example 1, and the result was 2027 Å/min.

Comparative Example 5

0.665 mass % of the colloidal silica dispersion liquid (silica particle content: 20 mass %) of Silica Particle 1 (corresponding to 0.133 mass % as silica particles) and 99.335 mass % of water were mixed, whereby a CMP polishing liquid containing silica particles of 0.133 mass % was prepared.

With respect to this CMP polishing liquid, the pH of the CMP polishing liquid and the average particle diameter of silica particles were measured by the same operation as in Example 1, and the pH was 7.2 and the average particle diameter was 57 nm. The polishing rate for the silicon oxide layer with the CMP polishing liquid was also determined by the same operation as in Example 1, and the result was 1 Å/min.

Examples 4 to 11 and Comparative Example 5 are given in Table 4.

TABLE 4

| | First particle | Second particle | State of abrasive particle | Abrasive particle content (mass %) | Silica particle content (mass %) | Cerium hydroxide particle content (mass %) | Average particle diameter (nm) | pH | SiO$_2$RR (Å/min) |
|---|---|---|---|---|---|---|---|---|---|
| Example 4 | Silica Particle 1 | Cerium hydroxide particle | Mixed- particle of composite particle and single particle | 0.2 | 0.133 | 0.067 | (Composite particle) 67 | 6.1 | 3311 |
| Example 5 | Silica Particle 2 | Cerium hydroxide particle | | 0.2 | 0.133 | 0.067 | (Composite particle) 66 | 6.0 | 3866 |
| Example 6 | Silica Particle 3 | Cerium hydroxide particle | | 0.2 | 0.133 | 0.067 | (Composite particle) 64 | 6.3 | 3680 |
| Example 7 | Silica Particle 4 | Cerium hydroxide particle | | 0.2 | 0.133 | 0.067 | (Composite particle) 72 | 6.2 | 2388 |
| Example 8 | Silica Particle 5 | Cerium hydroxide particle | | 0.2 | 0.133 | 0.067 | (Composite particle) 109 | 6.1 | 3796 |
| Example 9 | Silica Particle 6 | Cerium hydroxide particle | | 0.2 | 0.133 | 0.067 | (Composite particle) 66 | 6.0 | 4896 |
| Example 10 | Silica Particle 7 | Cerium hydroxide particle | | 0.2 | 0.133 | 0.067 | (Composite particle) 76 | 5.7 | 3034 |
| Example 11 | Silica Particle 8 | Cerium hydroxide particle | | 0.2 | 0.133 | 0.067 | (Composite particle) 21 | 5.8 | 2027 |
| Comparative Example 5 | Silica Particle 1 | — | Single particle | 0.133 | 0.133 | — | (Single particle) 57 | 7.2 | 1 |

As is obvious from Table 4, in all cases regardless of the types of silica particles used, the polishing rate for the silicon oxide layer with the CMP polishing liquid containing the silica/cerium hydroxide composite particles significantly increased in comparison to the polishing rate with the CMP polishing liquid that contains exclusively silica particles.

The foregoing has demonstrated that the polishing rate for the silicon oxide layer with the CMP polishing liquid containing silica/cerium hydroxide composite particles and having a pH equal to or lower than a predetermined value is significantly high and thus this liquid is an excellent CMP polishing liquid.

INDUSTRIAL APPLICABILITY

The present invention can provide a CMP polishing liquid that makes it possible to increase the polishing rate for insulating films, a method for manufacturing the CMP polishing liquid, a method for manufacturing a composite particle, and a method for polishing a base material by using the CMP polishing liquid. In particular, in a CMP technique for flattening a shallow trench isolation insulating film, a pre-metal insulating film, and an interlayer insulating film, for example, the present invention can provide a CMP polishing liquid that makes it possible to polish the insulating films at a high rate, a method for manufacturing the CMP polishing liquid, a method for manufacturing a composite particle, and a method for polishing a base material by using the CMP polishing liquid. Furthermore, the present invention can provide a CMP polishing liquid that makes it possible to polish the insulating films with fewer polishing scratches while increasing the polishing rate for insulating films, a method for manufacturing the CMP polishing liquid, a method for manufacturing a composite particle, and a method for polishing a base material by using the CMP polishing liquid.

The invention claimed is:

1. A CMP polishing liquid comprising:
   water; and
   an abrasive particle, wherein
   the abrasive particle comprises a composite particle having a core including a first particle, and a second particle provided on the core, wherein the second particle has a diameter of 0.1 to 100 nm,
   the first particle contains silica,
   the second particle is a cerium hydroxide particle, and
   pH of the CMP polishing liquid is equal to or lower than 9.5.

2. The CMP polishing liquid according to claim 1 used for polishing a surface to be polished that contains silicon oxide.

3. A method for polishing a base material, comprising a step of polishing a surface to be polished of a base material by using the CMP polishing liquid according to claim 1.

4. The CMP polishing liquid according to claim 1, wherein the average diameter of the composite particle is at least 40 nm.

5. The CMP polishing liquid according to claim 1, wherein the second particle has a diameter of 2 nm to 6 nm and is adhered to the core.

6. The CMP polishing liquid according to claim 1, wherein the second particle has a diameter of 0.1 to 50 nm.

7. The CMP polishing liquid according to claim 1, wherein the second particle has a diameter of 0.1 to 20 nm.

8. The CMP polishing liquid according to claim 1, wherein the second particle has a diameter of 0.1 to 10 nm.

9. The CMP polishing liquid according to claim 1, wherein the second particle has a diameter of great than or equal to 0.1 nm and less than 10 nm.

10. A method for manufacturing a CMP polishing liquid containing water and an abrasive particle, the method comprising
    a step of, in an aqueous solution that contains a first particle containing silica, a first component containing a tetravalent cerium salt precursor of cerium hydroxide, and a second component that is capable of reacting with the precursor to precipitate a second cerium hydroxide particle, precipitating the second particle by reacting the precursor and the second component to obtain a composite particle having a core including the first particle, and the second particle provided on the core, wherein
    the abrasive particle comprises the composite particle, and
    pH of the CMP polishing liquid is equal to or lower than 9.5.

11. The method for manufacturing a CMP polishing liquid according to claim 10, wherein the composite particle is obtained by mixing a liquid containing the first particle and the first component with a liquid containing the second component.

12. The method for manufacturing a CMP polishing liquid according to claim 10, wherein the precursor is a tetravalent cerium salt and the second component is a basic compound.

13. The method for manufacturing a CMP polishing liquid according to claim 10, the method further comprising a step of dispersing the composite particle in water.

14. The method for manufacturing a CMP polishing liquid according to claim 10, the method further comprising a step of washing the composite particle.

15. A method for manufacturing a composite particle, comprising
    a step of, in an aqueous solution that contains a first particle containing silica, a first component containing a tetravalent cerium salt precursor of cerium hydroxide, and a second component that is capable of reacting with the precursor to precipitate a second cerium hydroxide particle, precipitating the second particle by reacting the precursor and the second component to obtain a composite particle having a core including the first particle, and the second particle provided on the core.

16. The method for manufacturing a composite particle according to claim 15, wherein the composite particle is obtained by mixing a liquid containing the first particle and the first component with a liquid containing the second component.

17. The method for manufacturing a composite particle according to claim 15, wherein the precursor is a tetravalent cerium salt and the second component is a basic compound.

* * * * *